United States Patent
Liu et al.

(10) Patent No.: US 9,305,851 B2
(45) Date of Patent: Apr. 5, 2016

(54) SYSTEMS AND METHODS FOR CHEMICAL MECHANICAL PLANARIZATION WITH FLUORESCENCE DETECTION

(71) Applicant: Taiwan Semiconductor Manufacturing Company Limited, Hsinchu (TW)

(72) Inventors: I-Shuo Liu, Hsinchu (TW); Hui-Chi Huang, Hsinchu County (TW); Jung-Tsan Tsai, New Taipei (TW); Chien-Ping Lee, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 8 days.

(21) Appl. No.: 14/083,818

(22) Filed: Nov. 19, 2013

(65) Prior Publication Data

US 2015/0140691 A1 May 21, 2015

(51) Int. Cl.
*B24B 37/013* (2012.01)
*B24B 49/04* (2006.01)
*H01L 21/66* (2006.01)
*B24B 37/005* (2012.01)
*B24B 37/04* (2012.01)
*B24B 37/20* (2012.01)
(Continued)

(52) U.S. Cl.
CPC .............. *H01L 22/26* (2013.01); *B24B 37/005* (2013.01); *B24B 37/044* (2013.01); *B24B 37/205* (2013.01); *B24B 49/12* (2013.01); *H01L 21/3212* (2013.01); *H01L 22/12* (2013.01)

(58) Field of Classification Search
CPC ....................................................... B24B 1/00
See application file for complete search history.

(56) References Cited

U.S. PATENT DOCUMENTS

| | | | |
|---|---|---|---|
| 6,939,198 B1 * | 9/2005 | Swedek ................ | B24B 37/013 451/41 |
| 2004/0203320 A1 * | 10/2004 | Hosaka ................. | B24B 37/205 451/6 |

FOREIGN PATENT DOCUMENTS

| | | |
|---|---|---|
| JP | 2001342454 A | 12/2001 |
| JP | 2002346920 A | 4/2002 |
| JP | 2005294365 A | 10/2005 |

OTHER PUBLICATIONS

Abuin, Elsa, Lissi, Eduardo, Aspee, Alexis, Gonzalez, Fernando, Varas, Jose; Fluorescence of 8-Anilinonaphthalene-1-sulfonate and Properties of Sodium Dodecyl Sulfate Micelles in Water-Urea Mixtures; Journal of Colloid and Interface Science, 186; pp. 332-338; 1997.

(Continued)

*Primary Examiner* — Mohammad Choudhry
(74) *Attorney, Agent, or Firm* — Jones Day

(57) ABSTRACT

Systems and methods are provided for performing chemical-mechanical planarization on an article. An example system for performing chemical-mechanical planarization on an article includes a polishing head configured to perform a chemical-mechanical planarization (CMP) on an article, a polishing pad configured to support the article, a light source configured to emit an incident light, a polishing fluid including a plurality of emitter particles capable of emitting a fluorescent light in response to the incident light, a fluorescence light detector configured to detect the fluorescent light, and at least one processor configured to control the polishing head based on the detected fluorescent light.

14 Claims, 8 Drawing Sheets

(51) Int. Cl.
  *B24B 49/12* (2006.01)
  *H01L 21/321* (2006.01)

(56) References Cited

OTHER PUBLICATIONS

Khan, Asad Muhammad, Shah, Syed Sakhawat; Determination of Critical Micelle Concentration (Cmc) of Sodium Dodecyl Sulfate (SDS) and the Effect of Low Concentration of Pyrene on its Cmc Using Origin Software; Journal of the Chemical Society of Pakistan, 30(2); pp. 186-191; 2008.

Torchilin, Vladimir; Structure and Design of Polymeric Surfactant-Based Drug Delivery Systems; Journal of Controlled Release, 73; pp. 137-172; 2001.

Korean Office Action; Application No. 10-2014-0122588; dated Jun. 24, 2015.

Korean Notice of Allowance; Application No. 10-2014-0122588; dated Oct. 2, 2015.

* cited by examiner

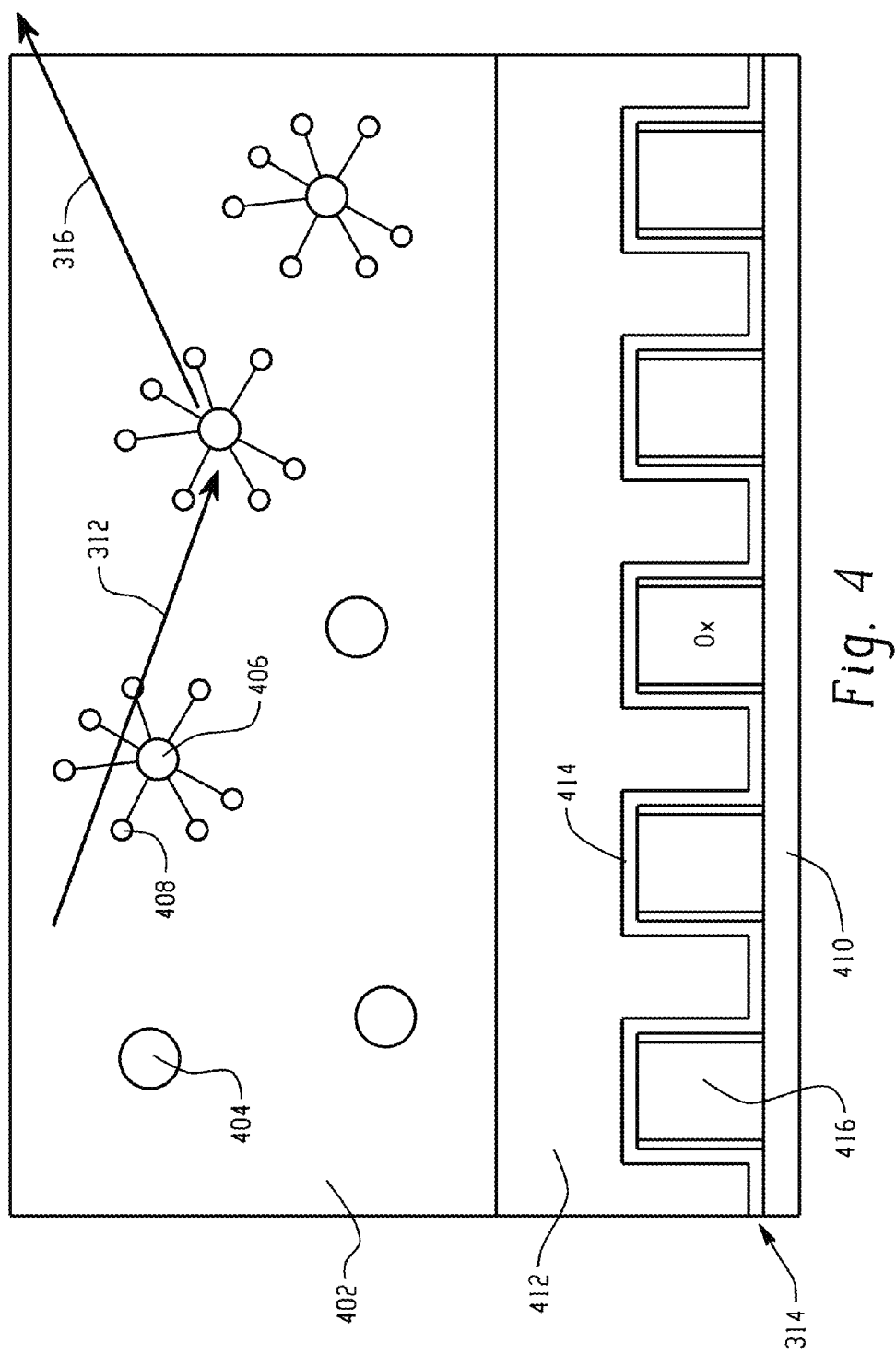

SYSTEMS AND METHODS FOR CHEMICAL MECHANICAL PLANARIZATION WITH FLUORESCENCE DETECTION

FIELD

The technology described in this disclosure relates generally to material processing and more particularly to planarization.

BACKGROUND

Semiconductor devices are often fabricated through multiple processes, for example, chemical-mechanical planarization (CMP), etching, etc. A CMP process is often used for planarizing surfaces of a wafer with a combination of chemical and mechanical forces. Mechanical grinding alone causes many surface damages, while wet etching alone cannot attain good planarization. The CMP process involves both the mechanical grinding and the wet etching to generate a smooth surface on a wafer, and prepare the wafer for subsequent processes (e.g., photolithography). For example, the CMP process is used to avoid depth focus problems during photolithography.

SUMMARY

In accordance with the teachings described herein, systems and methods are provided for performing chemical-mechanical planarization on an article. An example system for performing chemical-mechanical planarization on an article includes a polishing head, a fluorescent light source, a polishing fluid, a polishing pad, a fluorescence detector and one or more processors. The polishing head is configured to perform chemical-mechanical planarization (CMP) on an article. The polishing pad is configured to support the article. The fluorescent light source is configured to emit an incident light. The polishing fluid is configured to perform CMP including a plurality of emitter particles being capable of generating a fluorescent light in response to the incident light. The fluorescence detector is configured to detect the fluorescent light. The one or more processors are configured to control the polishing head based on the detected fluorescent light.

In one embodiment, a method is provided for performing chemical-mechanical planarization on an article. An incident light is provided. A chemical-mechanical planarization (CMP) is performed on an article using a polishing fluid, the polishing fluid including a plurality of emitter particles being capable of generating a fluorescent light in response to an incident light. The fluorescent light is detected. In response to the fluorescent light, the chemical-mechanical planarization is stopped.

BRIEF DESCRIPTION OF THE DRAWINGS

FIG. 4 and FIG. 5 depict example diagrams showing a polishing fluid including emitter particles and surfactant particles used in the CMP system as shown in FIG. 3(a) and FIG. 3(b).

DETAILED DESCRIPTION

The conventional CMP technology has some disadvantages. For example, it is hard to control when the CMP process is to be stopped with accuracy. In semiconductor device fabrication, usually a thin material layer (e.g., titanium nitride, silicon nitride) is used as a CMP stop layer for a CMP process and an etching hard mask for an etching process that follows the CMP process. The CMP process is supposed to stop when one or more material layers formed on the CMP stop layer are removed and the CMP stop layer (e.g., titanium nitride, silicon nitride) is exposed. If the CMP process is not stopped in time, the thin CMP stop layer may be removed and it cannot serve as the etching hard mask. Material layers under the CMP stop layer cannot be protected during the subsequent etching process.

Figure 1:
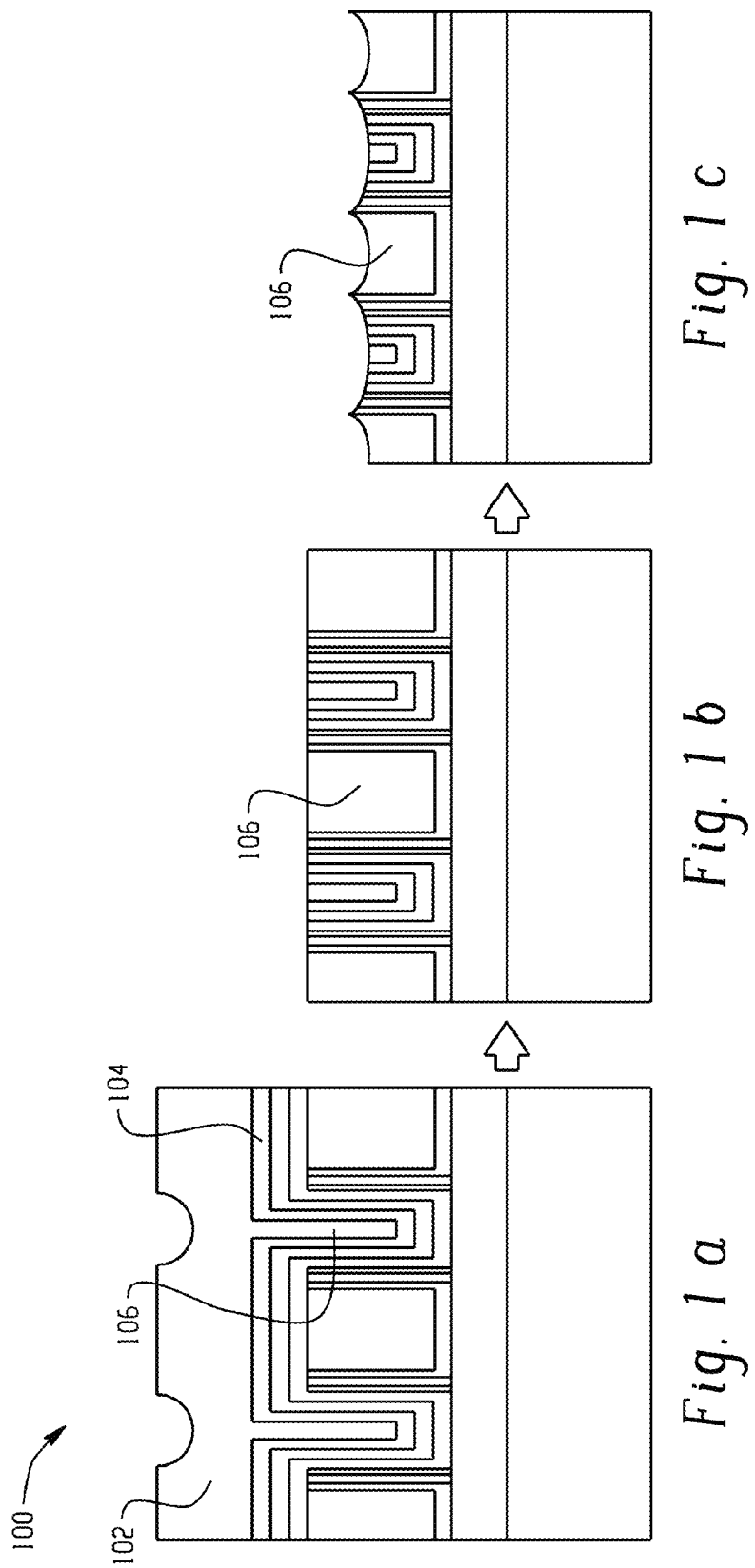
FIG. 1(a)-FIG. 1(c) depict example diagrams showing a wafer undergoing a CMP process and an etching process.

FIG. 1(a)-FIG. 1(c) depict example diagrams showing a wafer undergoing a CMP process and an etching process. As shown in FIG. 1(a), the wafer 100 includes one or more material layers 102 formed on a CMP stop layer 104 (e.g., a nitride layer) that covers a dielectric layer 106 (e.g., gate oxides). A CMP process is applied to the wafer 100 for planarization. If the CMP process does not stop when the CMP stop layer 104 is exposed, the CMP stop layer 104 on top of the dielectric layer 106 is removed and part of the dielectric layer 106 is removed as well, as shown in FIG. 1(b). Then, when the wafer 100 undergoes an etching process, at least part of the dielectric layer 106 is etched away without the protection of the CMP stop layer 104, as shown in FIG. 1(c).

Figure 2:
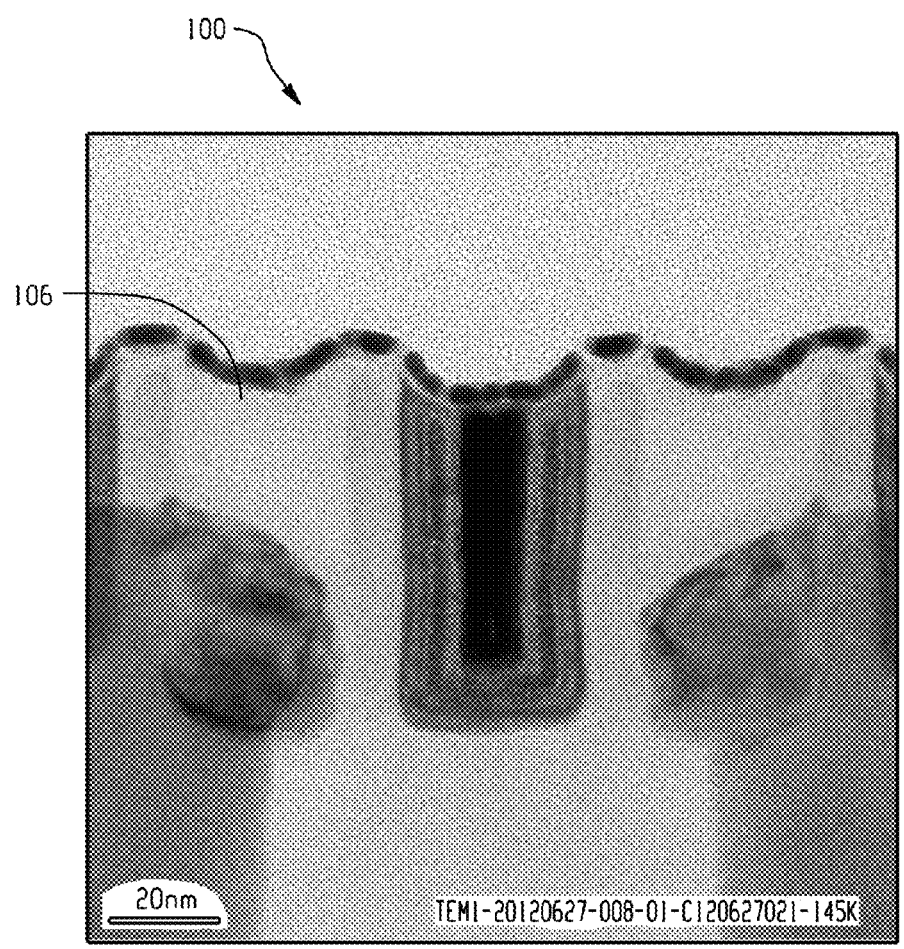
FIG. 2 depicts an example diagram showing a side view of a wafer after a CMP process and an etching process.

FIG. 2 depicts an example diagram showing a side view of the wafer 100 after the CMP process and the etching process. As shown in FIG. 2, because the CMP process does not stop when the CMP stop layer 104 (e.g., a nitride layer) is exposed, part of the dielectric layer 106 is etched away. For example, the final height of the dielectric layer 106 is severely reduced as a result.

The present disclosure describes systems and methods for performing a CMP process with fluorescence detection, so that the CMP process stops when a CMP stop layer (e.g., nitrides) is exposed to reduce the removal of the CMP stop layer during the CMP process.

Figure 3A:
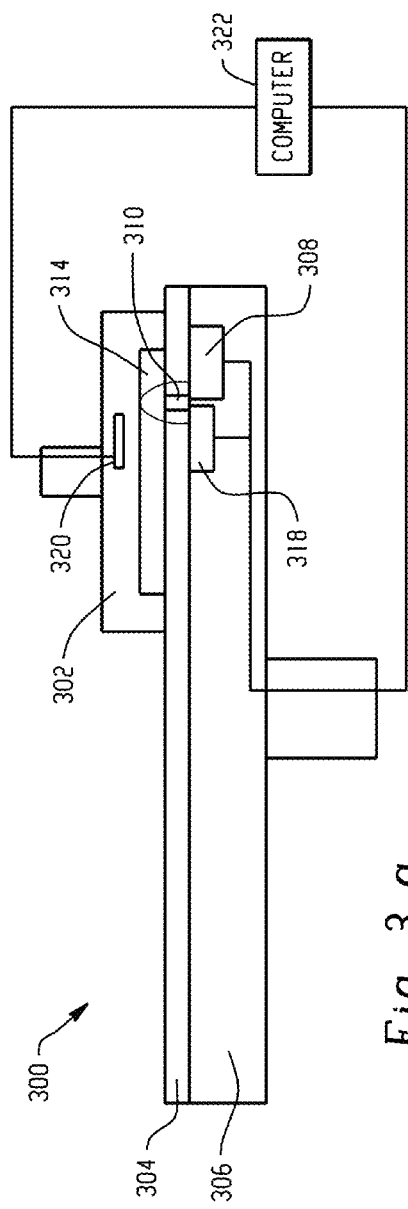
FIG. 3(a)-FIG. 3(b) depict example diagrams showing a CMP system with fluorescence detection.
Figure 3B:
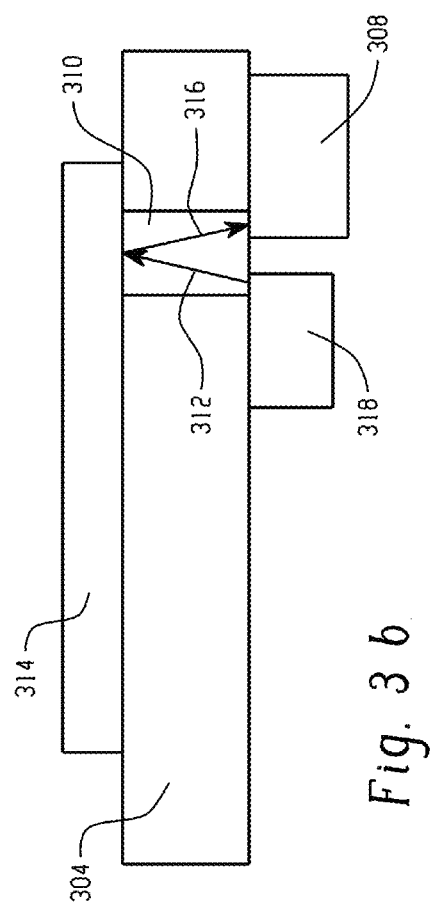

FIG. 3(a)-FIG. 3(b) depict example diagrams showing a CMP system with fluorescence detection. As shown in FIG. 3(a) and FIG. 3(b), the CMP system 300 includes a polishing head 302, a polishing pad 304, a platen 306, and a fluorescence detector 308. One or more small windows 310 in the polishing pad 304 allows an incident light 312 to pass through and fall on a wafer 314 that includes a CMP stop layer (e.g., a nitride layer), and allows a fluorescent light 316 to pass through to the fluorescence detector 308. The intensity of the fluorescent light 316 is affected when the CMP stop layer is exposed during the CMP process. The fluorescence detector 308 is configured to detect the change of the intensity of the fluorescent light 316 so as to stop the CMP process when the CMP stop layer is exposed after one or more material layers form on the CMP stop layer are removed. For example, the windows 310 are fabricated using one or more materials that are approximately transparent to the incident light 312 and the fluorescent light 316. In some embodiments, a first window is used to allow the incident light 312 to pass through, and a second window is used to allow the fluorescent light 316 to pass through. The two windows are fabricated with different materials which are approximately transparent to the incident light 312 and the fluorescent light 316 respectively.

In some embodiments, the CMP system 300 further includes a light source 318 that generates the incident light 312, a polish-head-rotation controller 320 and a computer 322 that includes one or more processors (not shown). For example, the polish-head-rotation controller 320 is configured to control the polishing head 302 to rotate and oscillate to bring the wafer 314 into contact with the polishing pad 304 that moves in the plane of the wafer surface to be planarized (e.g., together with the platen 306). The computer 322 is configured to control the light source 318 and/or the fluorescence detector 308. As an example, the computer 322 compares the detected intensity of the fluorescent light 316 with a predetermined threshold, and causes the polish-head-rotation controller 320 to stop the polishing head 302 if the detected intensity of the fluorescent light 316 is smaller than the predetermined threshold. In certain embodiments, the polishing pad 304 is made of stacks of soft and hard materials (e.g., porous polymeric materials).

Figure 5:
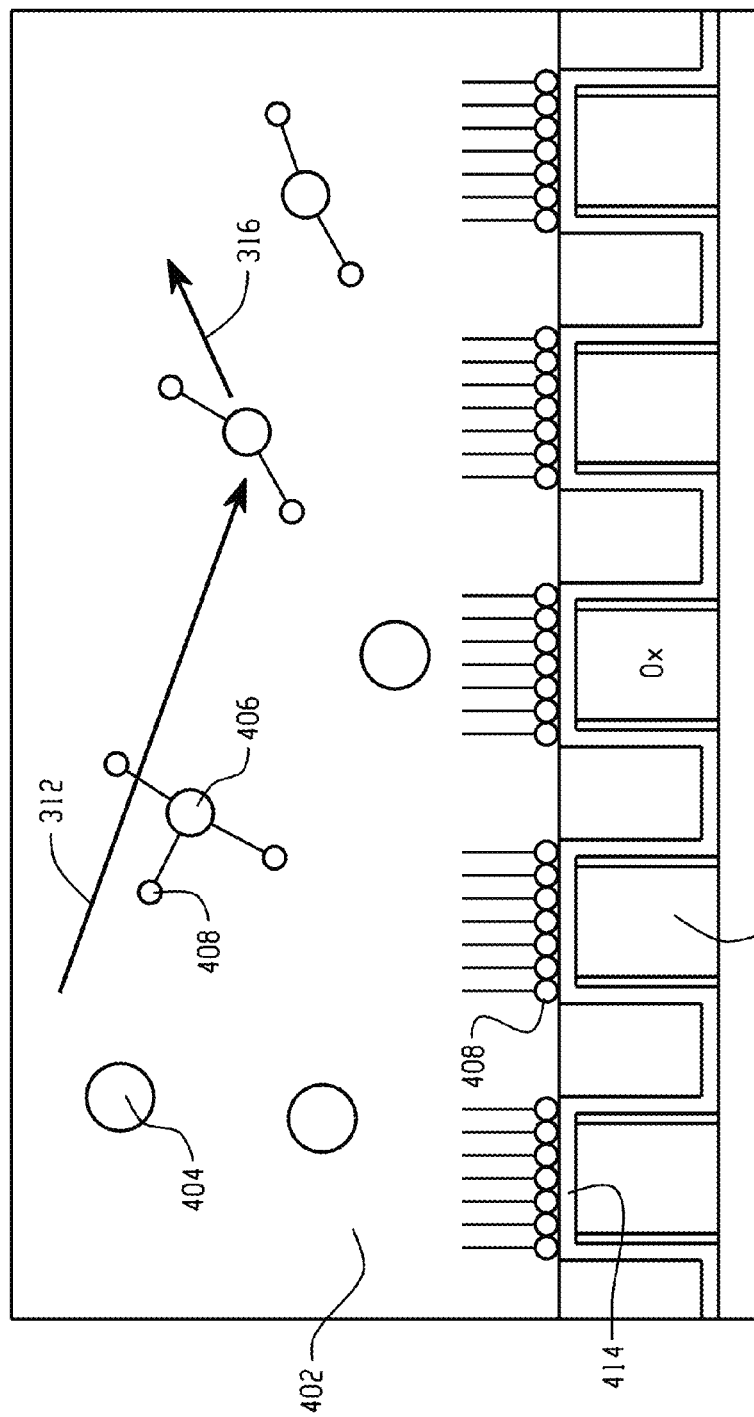

FIG. 4 and FIG. 5 depict example diagrams showing a polishing fluid including emitter particles and surfactant particles used in the CMP system 300. The polishing fluid 402 includes an abrasive and corrosive chemical slurry (e.g., a colloid). For example, as shown in FIG. 4, the polishing fluid 402 includes one or more abrasive materials 404, a plurality of emitter particles 406 capable of generating the fluorescent light 316 in response to the incident light 312, and a plurality of surfactant particles 408 capable of affecting the intensity of the fluorescent light 316. The wafer 314 includes multiple layers on a substrate 410. One or more material layers 412 are formed on a CMP stop layer 414 (e.g., a nitride layer) that is formed on a dielectric layer 416 (e.g., gate oxides). For example, the CMP stop layer 414 includes a nitride layer (e.g., silicon nitride, titanium nitride) and does not generate a fluorescent light in response to the incident light 312.

Specifically, at the beginning of the CMP process, the surfactant particles 408 are attached to one or more emitter particles 406 and the fluorescent light 316 has a high intensity. As the CMP process continues, the material layers 412 formed on the CMP stop layer 414 are removed, and at least part of the CMP stop layer 414 is exposed. The surfactant particles 408 begin to attach to the CMP stop layer 414. For example, the surfactant particles 408 previously attached to the emitter particles 406 detach from the emitter particles 406 and move to the surface of the CMP stop layer 414. In response, the intensity of the fluorescent light 316 begins to decrease. As shown in FIG. 5, when most surfactant particles 408 attach to the CMP stop layer 414, the fluorescent light 316 has a very low intensity. The fluorescence detector 308 detects such changes in the intensity of the fluorescent light 316, and the CMP process is stopped when the intensity of the fluorescent light 316 drops below a threshold. For example, the abrasive materials 404 include silica.

Figure 6:
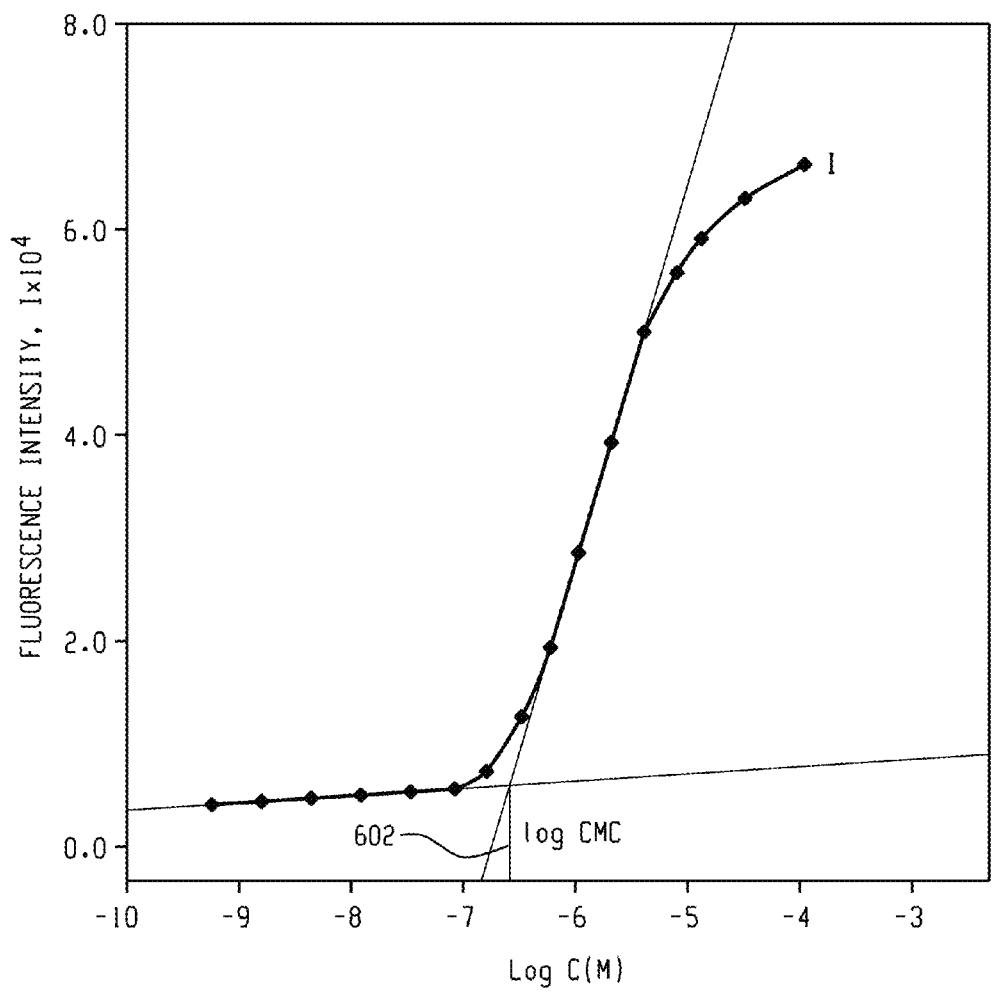
FIG. 6 depicts an example diagram showing intensity of a fluorescent light changes with a concentration of surfactant particles in a polishing fluid.

FIG. 6 depicts an example diagram showing the intensity of the fluorescent light 316 changes with the concentration of the surfactant particles 408 in the polishing fluid 402. When the surfactant particles 408 begin to attach to the CMP stop layer 414, the concentration of the surfactant particles 408 in the polishing fluid 402 begins to decrease. As shown in FIG. 6, when the concentration of the surfactant particles 408 in the polishing fluid 402 decreases toward a magnitude 602, the fluorescence intensity decreases drastically. For example, a fluorescence intensity threshold is set at $2 \times 10^4$ (a.u.), and the CMP process is stopped when the intensity of the fluorescent light 316 becomes lower than the set threshold.

Figure 7:
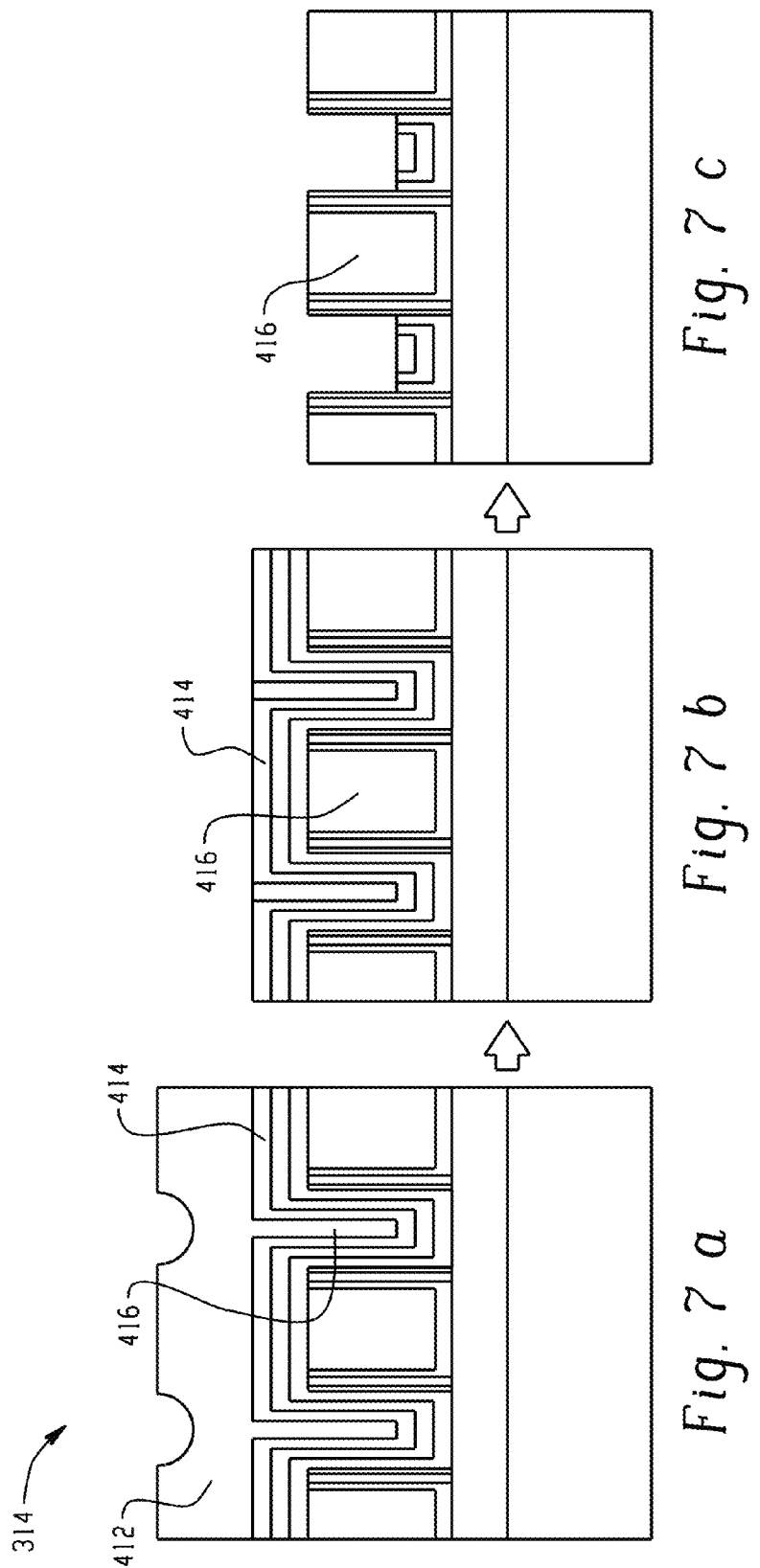
FIG. 7(a)-FIG. 7(c) depict example diagrams showing a wafer undergoing a CMP process in a CMP system and an etching process.

FIG. 7(a)-FIG. 7(c) depict example diagrams showing the wafer 314 undergoing a CMP process in the CMP system 300 and an etching process. As shown in FIG. 3(a), the wafer 314 includes the material layers 412 formed on the CMP stop layer 414 (e.g., a nitride layer) that covers a dielectric layer 416 (e.g., gate oxides). A CMP process is applied to the wafer 314 in the CMP system 300 with fluorescence detection, as shown in FIG. 3-FIG. 5. Because the exposure of the CMP stop layer 414 is detected using fluorescence detection, an end point of the CMP process is determined with improved accuracy. As shown in FIG. 7(b), the CMP process stops when the CMP stop layer 414 is exposed, and the dielectric layer 416 under the CMP stop layer 414 is protected. The CMP stop layer 414 is subsequently removed, through an etching process and/or certain other processes, as shown in FIG. 7(c).

Figure 8:
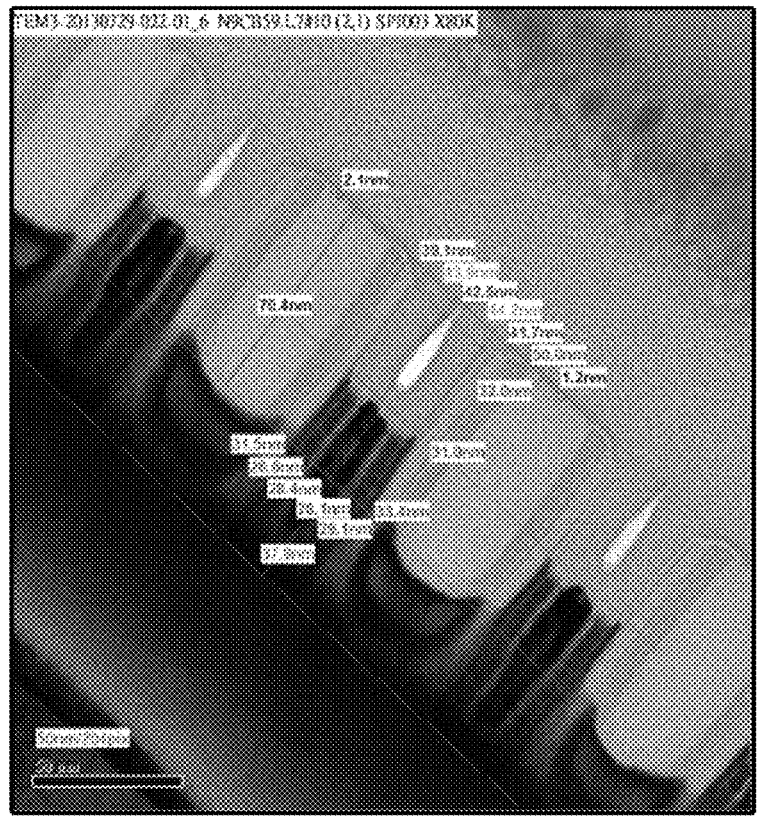
FIG. 8 depicts an example diagram showing a side view of a wafer after a CMP process and an etching process.

FIG. 8 depicts an example diagram showing a side view of the wafer 314 after the CMP process and the etching process. As shown in FIG. 8, because the CMP process stops when the CMP stop layer 414 (e.g., a nitride layer) is exposed, a deep etch depth is exhibited, and the final height of the dielectric layer 416 is not severely reduced.

Figure 9:
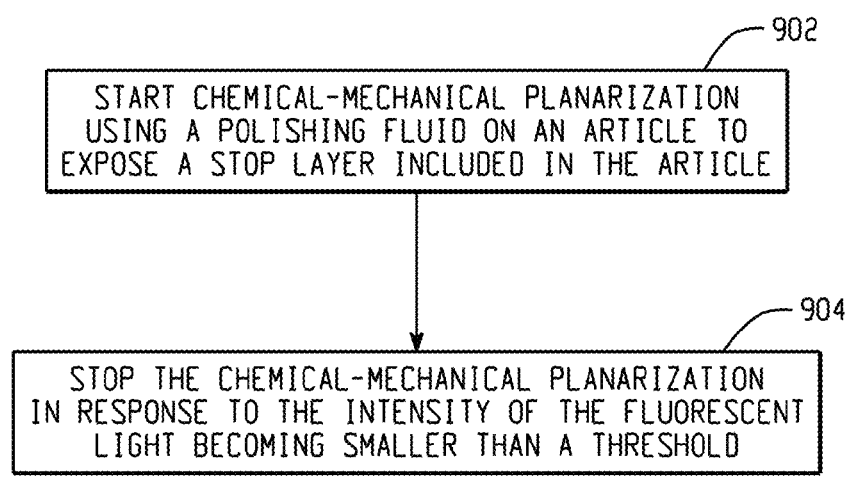
FIG. 9 depicts an example flow chart for performing chemical-mechanical planarization on an article.

FIG. 9 depicts an example flow chart for performing chemical-mechanical planarization on an article. At 902, chemical-mechanical planarization on an article is started using a polishing fluid to expose a stop layer included in the article. The polishing fluid includes a plurality of emitter particles and a plurality of surfactant particles. The emitter particles are capable of generating a fluorescent light in response to an incident light. The surfactant particles are capable of attaching to the stop layer to affect an intensity of the fluorescent light. At 904, the chemical-mechanical planarization is stopped in response to the intensity of the fluorescent light becoming smaller than a threshold.

For example, the emitter particles include certain II-VI semiconductor materials, e.g., CdS, CdSe, ZnS, ZnSe, ZnTe, or other suitable II-VI materials. In another example, the emitter particles include certain III-V semiconductor materials, e.g., InAs, InN, InP, GaN, GaP, GaAs, or other suitable III-V semiconductor materials. In some embodiments, the emitter particles include certain dye materials, e.g., azunite, sapphire, or other suitable dye materials. In certain embodiments, the emitter particles include certain fluorescence conducting polymer materials. In some embodiments, the surfactant particles include certain functional groups, e.g., hydroxyl groups, carboxyl groups, or other suitable functional groups.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as top, on, over, under, etc. that are used for descriptive purposes only and are not to be construed as limiting. The embodiments of a device or article described herein can be manufactured, used, or shipped in a number of positions and orientations. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "under" as used herein (including in the claims) may not indicate that a first layer/structure "under" a second layer/structure is directly under and in immediate contact with the second layer/structure unless such is specifically stated; there may be one or more third layers/structures between the first layer/structure and the second layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials).

What is claimed is:

1. A system comprising:
   an article including a chemical-mechanical planarization (CMP) stop material;
   a polishing head configured to perform a CMP on the article;
   a polishing pad configured to support the article;
   a light source configured to emit an incident light;
   a polishing fluid including a plurality of emitter particles that are capable of emitting a fluorescent light in response to the incident light and a plurality of surfactant particles that attach the emitter particles, wherein the surfactant particles are capable of detaching from the emitter particles and attaching to the CMP stop material when the CMP stop material is exposed to the polishing fluid;
   a fluorescence light detector configured to detect the fluorescent light, wherein the fluorescent light is detected to have a first intensity when the surfactant particles attach the emitter particles and the fluorescent light is detected to have a second intensity when the surfactant particles detach the emitter particles; and
   at least one processor configured to control the polishing head based on the detected fluorescent light.

2. The system of claim 1, wherein the at least one processor is configured to control the polishing head based on the intensity of the detected fluorescent light.

3. The system of claim 2, wherein the at least one processor is configured to control the polishing head to stop the CMP if the fluorescent light is detected to have the second intensity.

4. The system of claim 1, wherein the CMP stop material includes at least one of titanium nitride and silicon nitride.

5. The system of claim 1, wherein the CMP stop material forms a CMP stop layer in the article.

6. The system of claim 1, wherein the surfactant particles include organic molecules including at least one of a hydroxyl group and a carboxyl group.

7. The system of claim 1, wherein the emitter particles include at least one of CdS, CdSe, ZnS, ZnSe, ZnTe, InAs, InN, InP, GaN, GaP, GaAs, azunite, and sapphire.

8. The system of claim 1, wherein the polishing fluid further includes one or more abrasive materials.

9. A method comprising:
   providing an incident light;
   performing a chemical-mechanical planarization (CMP) on an article using a polishing fluid, the polishing fluid including a plurality of emitter particles that are capable of emitting a fluorescent light in response to an incident light and a plurality of surfactant particles that attach the emitter particles, wherein the surfactant particles are capable of detaching from the emitter particles and attaching to a CMP stop material of the article when the CMP stop material is exposed to the polishing fluid;
   detecting the fluorescent light; and
   adjusting the performing of the CMP in response to the detected fluorescent light, wherein the fluorescent light is detected to have a first intensity when the surfactant particles attach the emitter particles and the fluorescent light is detected to have a second intensity when the surfactant particles detach the emitter particles.

10. The method of claim 9, wherein the adjusting of the performing of the CMP is based on the intensity of the detected fluorescent light.

11. The method of claim 10, wherein the performing of the CMP is stop if the fluorescent light is detected to have the second intensity.

12. The method of claim 9, wherein the CMP stop material includes at least one of titanium nitride and silicon nitride.

13. The method of claim 9, wherein the CMP stop material forms a CMP stop layer in the article.

14. The method of claim 9, wherein the article is for fabricating at least one of semiconductor devices.

* * * * *